(12) United States Patent
Arnal et al.

(10) Patent No.: US 6,706,589 B2
(45) Date of Patent: Mar. 16, 2004

(54) MANUFACTURING OF CAPACITORS WITH METAL ARMATURES

(75) Inventors: Vincent Arnal, Grenoble (FR); Joaquim Torres, Saint Martin le Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/932,468

(22) Filed: Aug. 17, 2001

(65) Prior Publication Data

US 2002/0022332 A1 Feb. 21, 2002

(30) Foreign Application Priority Data

Aug. 17, 2000 (FR) .............................. 00 10697

(51) Int. Cl.$^7$ ............... H01L 21/8242; H01L 21/20
(52) U.S. Cl. ................ 438/253; 438/255; 438/259; 438/396
(58) Field of Search ............... 438/255, 396, 438/259, 262, 264, 964, 656, 253, 397, 391; 257/308, 306, 307, 309

(56) References Cited

U.S. PATENT DOCUMENTS

| | | | |
|---|---|---|---|
| 5,162,248 A | * 11/1992 | Dennison et al. | 438/396 |
| 5,270,241 A | * 12/1993 | Dennison et al. | 216/6 |
| 5,480,824 A | 1/1996 | Jun | |
| 5,804,852 A | * 9/1998 | Yang et al. | 257/306 |
| 5,895,250 A | * 4/1999 | Wu | 438/253 |
| 5,976,981 A | * 11/1999 | Cheng | 257/306 |
| 6,207,496 B1 | * 3/2001 | Kang | 438/253 |
| 6,300,191 B1 | * 10/2001 | Yu et al. | 438/253 |
| 6,399,440 B1 | * 6/2002 | Miao | 438/255 |
| 6,403,444 B2 | * 6/2002 | Fukuzumi et al. | 438/255 |
| 2001/0026987 A1 | * 10/2001 | Fazan et al. | 438/381 |

FOREIGN PATENT DOCUMENTS

EP 0 862 203 A1 9/1998

OTHER PUBLICATIONS

French Search Report from French Patent Application 00 10697, filed Aug. 17, 2000.

* cited by examiner

Primary Examiner—Michael S. Lebentritt
(74) Attorney, Agent, or Firm—Lisa K. Jorgenson; James M. Morris; Wolf, Greenfield & Sacks, P.C.

(57) ABSTRACT

A method for forming a capacitor with metal armatures in metallization levels above an integrated circuit, including the steps of: depositing over the surface of an integrated circuit an insulating layer having a thickness ranging between 0.5 and 1.5 $\mu$m; digging into the insulating layer to form trenches, of which at least a portion in top view is parallel and separate from one trench to the other; depositing and leveling a metallic material to form conductive lines in the trenches; locally removing the insulating layer to remove it at least from all the intervals separating two conductive lines; conformally depositing a dielectric; and depositing and etching a second metallic material to at least completely fill the intervals between lines.

10 Claims, 4 Drawing Sheets

MANUFACTURING OF CAPACITORS WITH METAL ARMATURES

BACKGROUND OF THE INVENTION

1. Field of the Invention

The present invention generally relates to the forming, in monolithic form, high-capacitance capacitors, for example for decoupling elements or resonant circuits, including metal armatures. More specifically, the present invention relates to the manufacturing of such capacitors by means of interconnection metallizations formed in the upper portion of an integrated circuit.

2. Discussion of the Related Art

FIGS. 1A to 1D illustrate, in a simplified partial cross-section view, a method for making such transistors. The method starts, as illustrated in FIG. 1A, with the deposition, on a substrate 1, of an insulating layer 2 so that its upper surface is substantially planar. Substrate 1 is essentially formed of an insulating region, which may include vertical conductive contacts or vias. Layer 2 is then etched to form an opening 3 at the location where the capacitor is to be formed.

At the next steps, illustrated in FIG. 1B, a metal layer 4 corresponding to an interconnection metallization is deposited and a chem-mech polishing (CMP) is then performed to leave thereof the portion contained in opening 13.

In the successive operation of filling of opening 3 and of leveling of layer 4, a notch or depression 5 generally forms in the surface of metal layer 4 at the level of the contact area between layer 4 and insulating layer 2. Notch 5 may have a depth on the order of a few tens of nanometers. Further, and although this has not been shown in the drawings, the leveling of material 4 is generally not perfect. It upper surface exhibits a dome rounded shape.

At the next step, illustrated in FIG. 1C, an insulating layer 6 of very small thickness, on the order of a few tens of nanometers, intended for forming the capacitor dielectric, is deposited and etched.

At the next steps, a second electrode is formed opposite to the first electrode.

According to an embodiment, illustrated in FIG. 1D, a second metal layer 7 is deposited and etched to be given the shape desired for the second electrode. A capacitor has thus been formed, two metal armatures 4 and 7 of which are separated by an insulator 6.

A disadvantage of such a method is that the thickness of layer 6 cannot be as reduced as it would be desired. Indeed, its continuity must be ensured between the two electrodes. Now, notch 5 has a depth greater than the minimum thickness of layer 6 determined by the insulation criteria. If layer 6 is too thin, it risks exhibiting discontinuities in notch 5.

To avoid this disadvantage, another conventional method for making a capacitor with two metal armatures provides initial steps similar to those previously described in relation with FIGS. 1A to 1C. However, the second electrode is not directly etched, but rather formed by repeating the preceding steps. The result of such a method is illustrated in FIG. 2.

After the deposition and etching of dielectric layer 6 previously described in relation with FIG. 1C, an insulating layer 8 is deposited and opened. Layer 8 is similar to layer 2. Layer 8 is opened across a width W3. To guarantee that the fragile area including notches 5 is not covered, width W3 is smaller than width W1 of first electrode 4. A metal layer 9 of a material similar to that of layer 4 is deposited and then leveled by CMP, as previously described in relation with FIG. 1C.

A compared to the preceding method, this method has the advantage of avoiding that second electrode 9 covers the area including notch 5. In terms of capacitance, this enables avoiding notch 5 and the associated leakage currents. However, this method has the disadvantage that the CMP leveling of layer 9 is relatively difficult. Indeed, as previously specified, the upper surface of layer 4 is not planar. This lack of surface evenness is reproduced by layer 9, and this enhances the complexity of etching of the material of layer 9. Further, the etching of insulating layer 8 by stopping on insulator 6 risks damaging it.

Further, whatever the method used, the capacitor surface area is equal to that of the smallest of the two portions of opposite interconnection layers and is limited by the available surface area above the integrated circuit.

Thus, as a non-limiting example, while the surface area available to create a capacitor ranges between 100 and $10^6$ $\mu m^2$, typically, 10000 $\mu m^2$, the real capacitive coupling surface area ranges between 90 and $0.9.10^6$ $\mu m^2$, typically 9900 $\mu m^2$. The capacitance of the obtained capacitors then ranges between 0.1 and $10^3$ pF.

SUMMARY OF THE INVENTION

The present invention aims at providing a method for forming capacitors with metal armatures formed above an integrated circuit having for a same integration surface area a greater capacitance than that obtained by conventional methods by developing opposite surfaces.

Another object of the present invention is to provide such a method which avoids the previously-discussed manufacturing disadvantages.

To achieve these and other objects, the present invention provides a method for forming a capacitor with metal armatures in metallization levels above an integrated circuit, including the steps of:

a) depositing over the surface of an integrated circuit an insulating layer having a thickness ranging between 0.5 and 1.5 $\mu m$;

b) digging into the insulating layer to form trenches, of which at least a portion in top view is parallel and separate from one trench to the other;

c) depositing and leveling a metallic material to form conductive lines in the trenches;

d) locally removing the insulating layer to remove it at least from all the intervals separating two conductive lines;

e) conformally depositing a dielectric; and f) depositing and etching a second metallic material to at least completely fill the intervals between lines.

According to an embodiment of the present invention, step a) of deposition of the insulating layer is preceded by the forming in the underlying integrated circuit of a metal plate, the next step b) of digging into the insulating layer being performed so that the trenches all expose at least partially said metal plate.

According to an embodiment of the present invention, step b) of digging into the insulating layer is performed to give to the trenches, in top view, a comb shape.

According to an embodiment of the present invention, the trenches are formed during step b) of digging into the insulating layer to have in top view the shape of two interdigited combs.

According to an embodiment of the present invention, step d) of removal of the insulating layer is performed across a given width ranging between 1 and 1.5 $\mu m$.

According to an embodiment of the present invention, the dielectric has a thickness ranging between 10 and 100 nm.

According to an embodiment of the present invention, step d) of local removal of the insulating layer is performed to draw a comb in top view.

According to an embodiment of the present invention, the second metallic material at step f) is deposited and etched to expose the planar portions of the dielectric covering the upper surfaces of the insulating layer and conductive lines of the first metallic material.

According to an embodiment of the present invention, the dielectric is silicon oxide or tantalum oxide.

According to an embodiment of the present invention, the first metallic material is copper, and the second metallic material is titanium or tungsten.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings and, further, as usual in the representation of integrated circuits, the various drawings are not to scale.

Figure 3A:
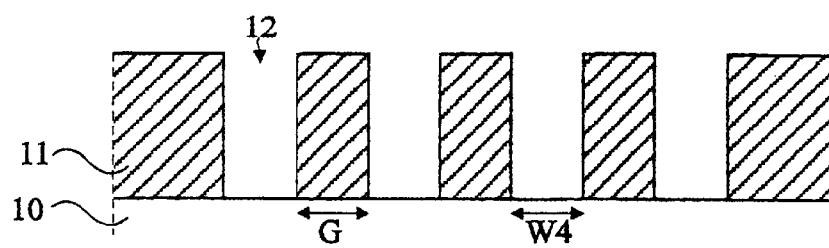
FIGS. 3A to 3F illustrate an embodiment of a capacitor with metal armatures according to the present invention, FIGS. 3A and 3C to 3F being cross-section views and FIG. 3B being a top view.
Figure 3B:
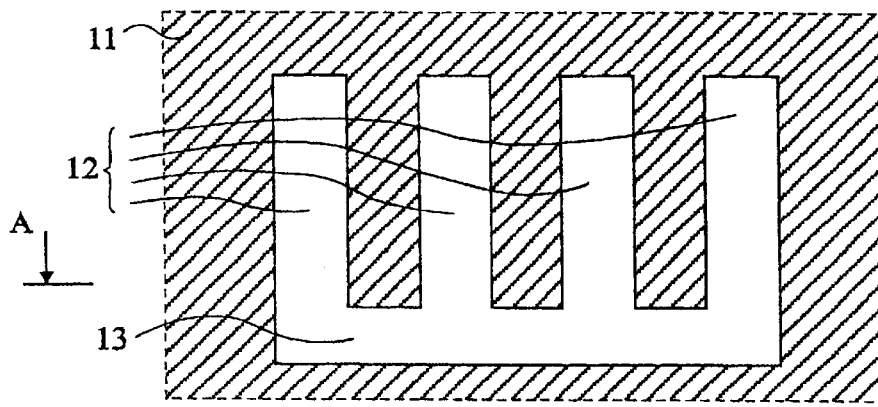

A first embodiment of the present invention is described hereafter in relation with FIGS. 3A to 3F. FIGS. 3A and 3C to 3F are partial simplified cross-section views of an integrated circuit at different steps of the forming of a capacitor with metal armatures. FIG. 3B is a partial simplified top view of a structure at the end of the step described in relation with FIG. 3A.

Figure 1A:
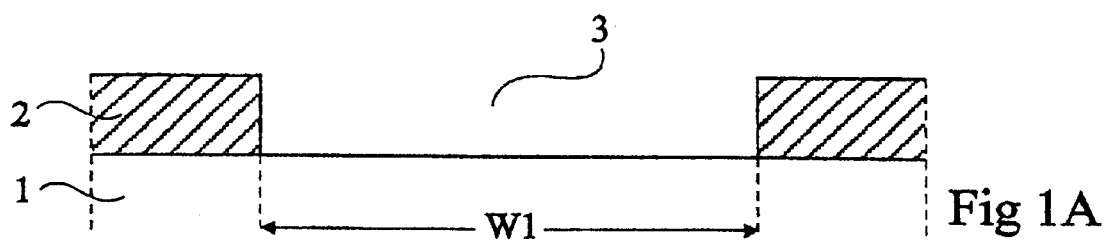
FIGS. 1A to 1D illustrate, in partial simplified cross-section views, a conventional method of formation of a capacitor with metal armatures.
Figure 1B:
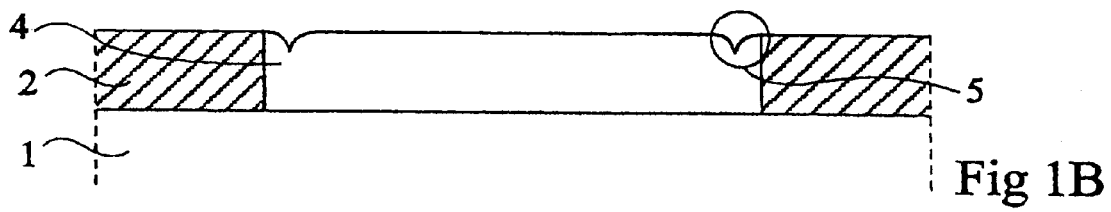
Figure 1C:
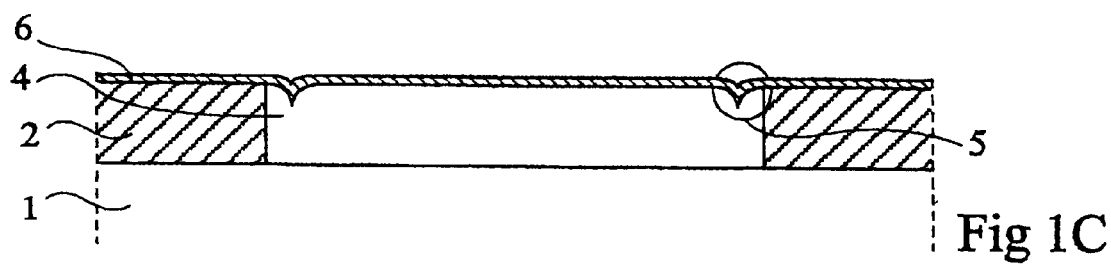
Figure 1D:
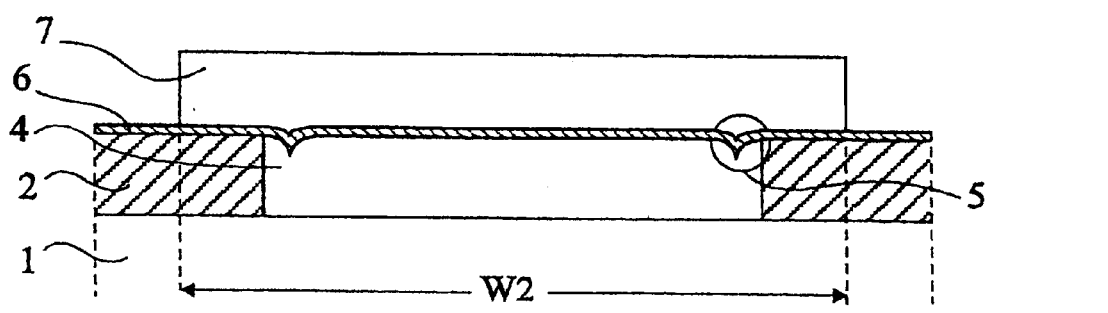
Figure 2:
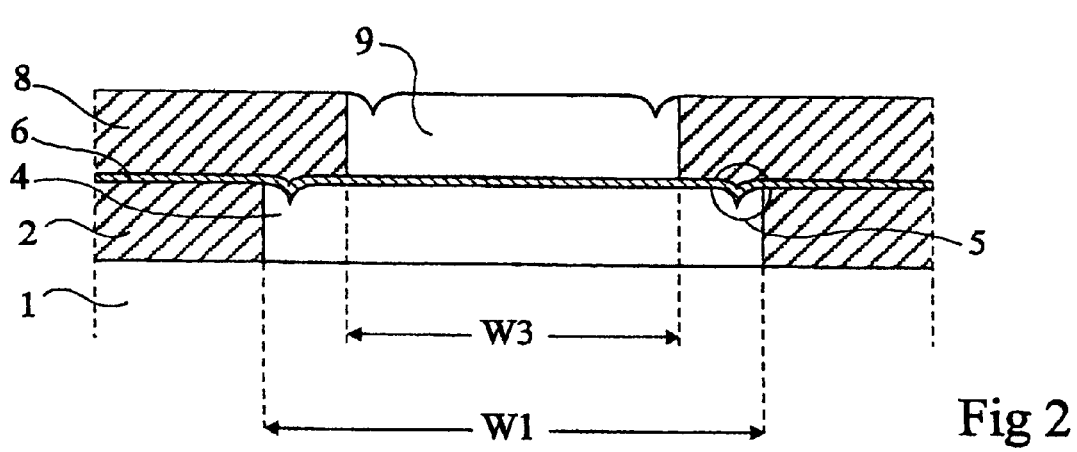
FIG. 2 illustrates, in a partial simplified cross-section view, the result of another conventional method of formation of a capacitor with metal armatures.

As illustrated in FIG. 3A, the method according to the present invention starts with the deposition, on an integrated circuit 10, of a thick insulating layer 11. The upper region of integrated circuit 10, illustrated in FIG. 3, is an insulating region. This insulating region is either an insulating region between interconnection metallization levels, or a layer of separation between underlying devices and the first metal interconnection level. Insulating layer 11 is thicker than a homologous conventional layer (2, FIG. 1; 2 and 8, FIG. 2) in a given technology. Parallel trenches 12 are then dug into insulating layer 11. Trenches 12 are formed across the entire thickness of layer 11. Trenches 12 are equidistant, of small width W4, and separated by a gap G of the same order of magnitude as width W4.

According to an embodiment, trenches 12 are interconnected by a perpendicular trench 13. In top view, as partially and schematically illustrated in FIG. 3B, a comb-shaped opening is thus formed. Axis A–A' of FIG. 3B is the cross-section axis of FIGS. 3A and 3C to 3F.

Figure 3C:
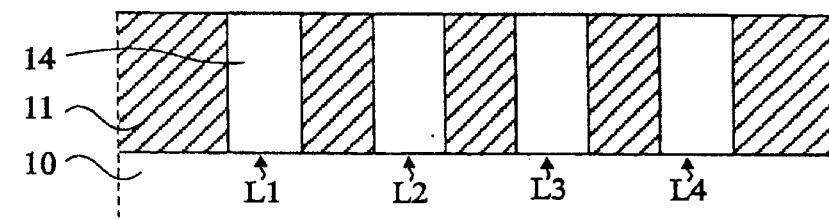

At the next steps, illustrated in FIG. 3C, a first metallic material 14 is deposited to completely fill trenches 12. Material 14 is a strongly conductive material such as copper or a copper-based alloy. Material 14 is then leveled by chem-mech polishing (CMP). Equidistant metal lines of the same dimension are thus formed. FIG. 3 illustrates as a non-limiting example four such lines L1, L2, L3, and L4. Metal lines L1, L2, L3, and L4 are interconnected by the simultaneous filling of perpendicular trench 13 illustrated in FIG. 3B. Other embodiments of such an interconnection will be described subsequently, especially in relation with FIGS. 5 and 6.

Given the alternation of the insulating materials of layer 11 and of metallic material 14, the leveling of lines L1–L4 is easier to perform than the leveling of a line with a relatively large width according to prior art (4, FIG. 1; 4 and 9, FIG. 2). Further, if the upper line surface is rounded, said rounding is excessively reduced and negligible as compared to the homologous phenomenon of conventional methods.

At the next steps, insulating layer 11 is removed in the region of capacitor formation. The portions of insulating layer 11 separating metal lines L1–L4 are thus completely removed. This results in the forming of separate parallel trenches 15.

Figure 3D:
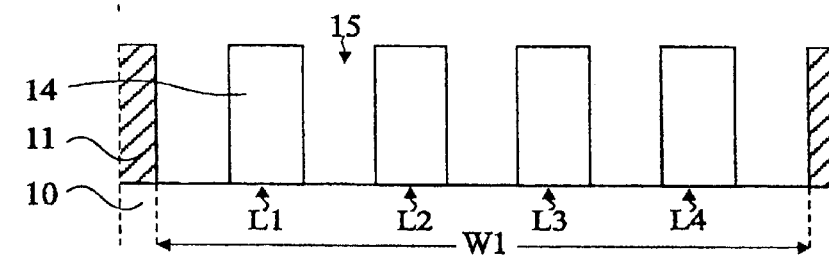

According to an alternative illustrated in FIG. 3D, layer 11 is also removed on either side of end lines L1 and L4, to also form trenches of the same dimensions as trenches 15 separating two neighboring lines.

More generally, this removal is performed across the entire surface (width W1) of the capacitor which is desired to be formed. The lateral ends of this surface may also be formed by end lines L1 and L4.

Figure 3E:
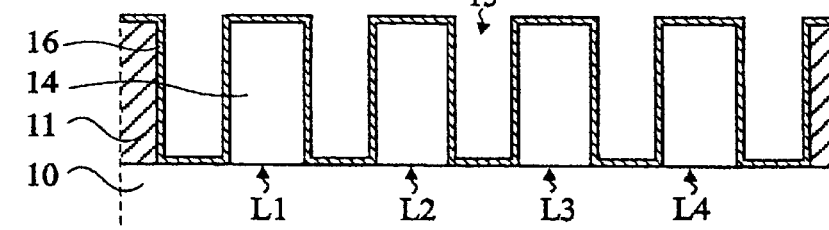

At the next steps, illustrated in FIG. 3E, a dielectric 16 is deposited. Dielectric 16 is conformally deposited in trenches 15 as well as on lines L1–L4. It should be noted that the very slight rounding of the upper angles of lines L1–L4 advantageously enables avoiding a breakage of the dielectric, which would risk occurring with a structure having right angles. Dielectric 16 is chosen from among the standard materials used to form capacitors. It may be a paraelectric or ferroelectric material, or an insulator such as, for example, silicon oxide ($SiO_2$), tantalum oxide ($Ta_2O_5$), or silicon nitride ($Si_3N_4$).

Figure 3F:
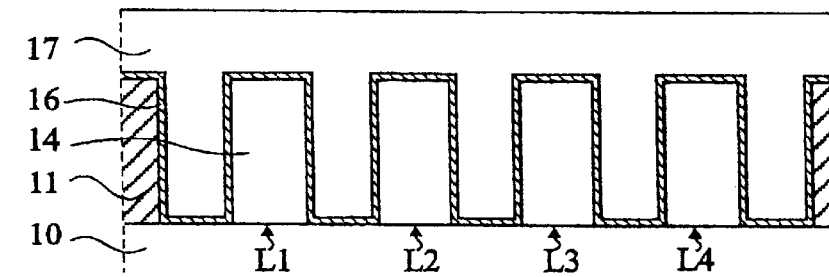

At the next steps, illustrated in FIG. 3F, a second metal interconnection level formed of a second metallic material 17 is formed. Material 17 is deposited and etched to at least completely fill trenches 15. Material 17 is either an easy-to-etch material such as for example tungsten, titanium, or aluminum, or a material which is difficult to etch only chemically such as copper or a copper-based alloy.

According to an embodiment illustrated in FIG. 3F, second material 17 is etched to extend beyond trenches 15. Second material 17 then has a vertical comb structure, the downward facing teeth of which are interposed between the teeth of the horizontal comb formed by first material 14.

A capacitor with vertical metal armatures has thus been formed across the thickness of layer 11, a first electrode of which is formed of first material 14, the inter-electrode insulator of dielectric 16, and the second electrode of second material 17.

The present invention enables obtaining based on a same surface area in top view a capacitor with a greater capacitance than that of a capacitor obtained by means of a conventional method. Indeed, while in prior art the capacitance used to be defined by the sole opposite planar surface area of the two electrodes, according to the present invention, most of the capacitance is defined across the thickness of layer 11, by the opposite vertical surface of the interdigited teeth of first and second electrodes 14 and 17. Of course, the capacitance also includes horizontal capacitive coupling components, especially between the planar upper parts of the lines and the horizontal portion of second electrode 17.

The method according to the present invention avoids formation of notches and thus limits leakage currents.

The method according to the present invention no longer raises the previously discussed problems of leveling complexity.

Further, risks of a direct contact of the two electrodes by breakage of the inter-electrode dielectric are reduced.

Figure 4A:
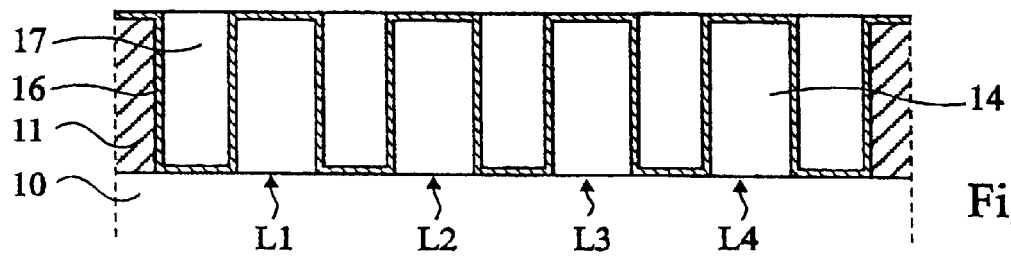
FIGS. 4A and 4B illustrate, partially and schematically, in a cross-section view and in a top view, respectively, a capacitor with metal armatures according to another embodiment of the present invention.

According to an alternative illustrated in FIG. 4A, material 17 is etched, for example, leveled, to be completely removed from the plane defined by the portions of dielectric 16 covering the upper surface of layer 11 and of lines L1–L4. The different portions of material 17 thus maintained in place are then interconnected by the filling of an additional trench perpendicular to all trenches 15. This additional trench is formed simultaneously to trenches 15 during the previously-described step of removal of insulating layer 11 (FIG. 3D).

Figure 4B:
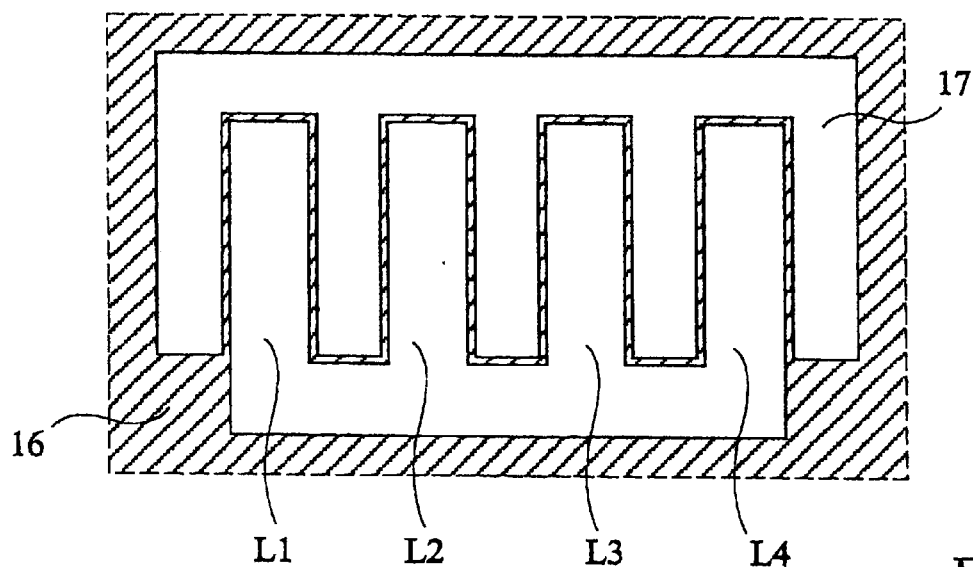

FIG. 4B illustrates in a partial simplified top view the structure of FIG. 4A. A second electrode has been formed in the shape of a horizontal comb, the teeth of which are interposed between lines L1–L4.

According to an alternative, not shown, the two preceding embodiments of the second electrode are combined.

The choice of the shape of the second electrode (horizontal comb, vertical comb, or combination of both shapes) will be performed according to the standard method sequences in which the forming of a capacitor according to the present invention incorporates. Thus, if the standard method provides no metallization above insulating layer 11, material 17 will be totally removed thereabove. In the opposite case, it may be maintained.

If it is maintained, it will be ascertained upon formation of the first electrode to provide an external contact to the planar surface on which the plate of the second electrode will be formed.

Figure 5:
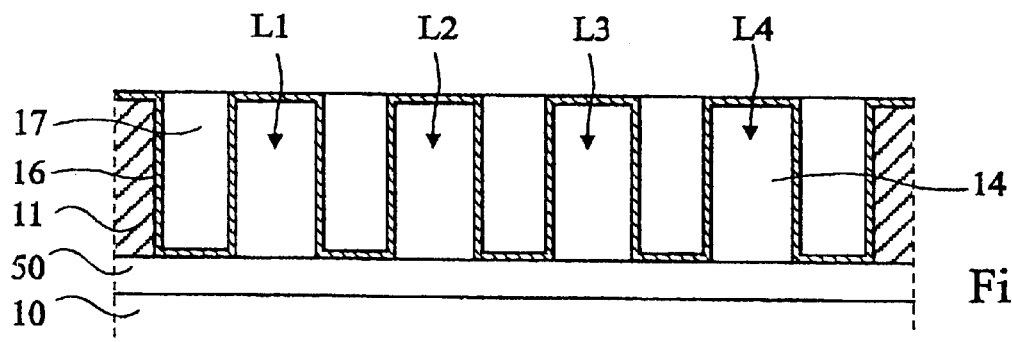
FIG. 5 illustrates, in a partial simplified cross-section view, another embodiment of the present invention.

According to another embodiment of the present invention, illustrated in a partial simplified cross-section view in FIG. 5, lines L1–L4 of material 14 are interconnected by means of an underlying metal plate 50. Metal plate 50 is formed in integrated circuit 10 before deposition of insulating layer 11. Trenches 12 are then dug so that all trenches 12 cross plate 50, no perpendicular trench (13, FIG. 3B) being dug. A first electrode is thus formed in the shape of a vertical comb, the teeth of which point upwards. Plate 50 has a surface area ranging between 100 and $10^6$ $\mu m^2$.

According to another embodiment, not shown, it is possible to combine the two preceding alternatives of interconnection of lines L1–L4. In process terms, a horizontal conductive metal plane similar to plate 50 of FIG. 5 is then formed in the integrated circuit, after which trenches (12, 13) are dug according to a horizontal comb pattern similar to that illustrated in FIGS. 3B and 4B.

Figure 6:
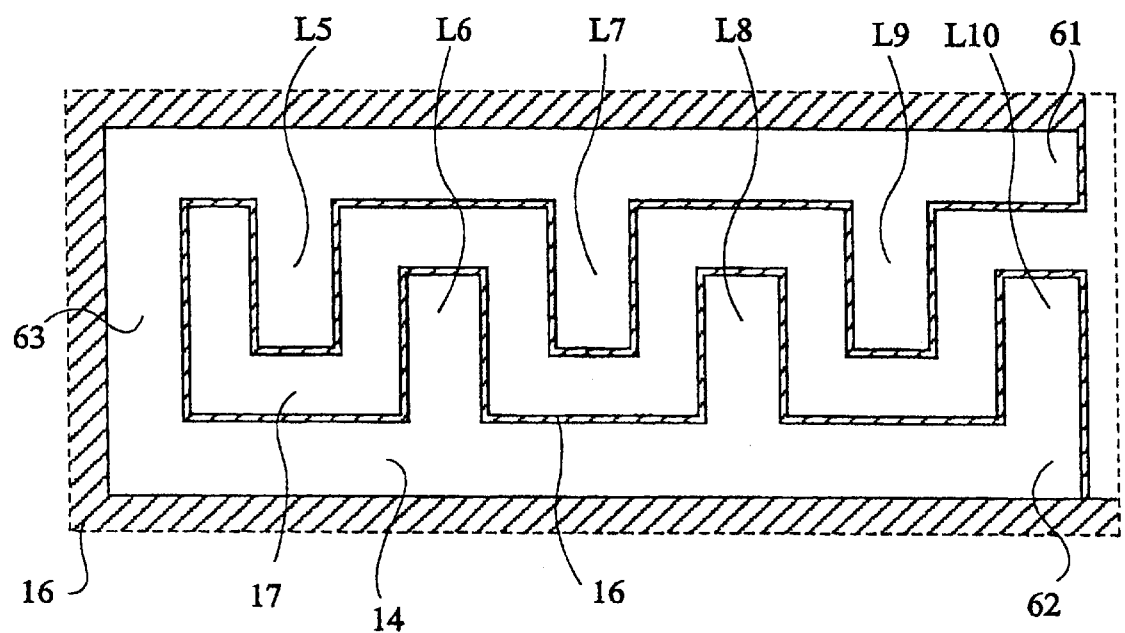
FIG. 6 illustrates, in a partial simplified top view, another embodiment of the present invention.

FIG. 6 illustrates, in a partial simplified top view, another embodiment of the first electrode. The metal lines are alternately connected to one of two perpendicular lines or branches. Each line of the first electrode connected to a branch is surrounded with two lines connected to the other branch. The two branches are then interconnected, either, as illustrated in FIG. 6, at the same level by a common end line, or at a higher level. The subsequent forming of a second common electrode enables forming capacitors in parallel. The active surface gain is then practically doubled. In FIG. 6, six such lines L5, L6, L7, L8, L9, L10 have been shown, from left to right, as a non-limiting example. Lines L5, L7, and L9 are connected to a first branch 61, at the top of FIG. 6. Lines L6, L8, and L10 are connected to a second branch 62, at the bottom of FIG. 6. The two branches 61 and 62 are interconnected in the same plane as lines L5, L6, L7, L8, L9, and L10 by an additional line 63, for example to the left of the structure. Second electrode 17 is formed by the filling of the interval separating branches 61 and 62. As previously, according to an alternative not shown, the second electrode may further include a planar portion covering the entire structure, and giving it a structure substantially like a vertical comb.

Further, the embodiments of a first electrode of FIGS. 5 and 6 may be combined. Two distinct plates will then be formed in the integrated circuit and each line will contact a single one of them. The two plates will be interconnected either in the integrated circuit, or by a common line, or at a higher level.

As a non-limiting example, the different materials used may be:

insulating layer 11: silicon oxide, of a thickness between 0.5 and 1.5 $\mu m$. As a comparison, an insulating encapsulation area of a homologous conventional capacitor (layers 2 and 8, FIG. 2) would have a thickness between 0.2 and 0.5 $\mu m$;

trenches 12: of a width W4 ranging between 0.15 and 0.3 $\mu m$; and separated by a gap G ranging between 0.15 and 0.3 $\mu m$. From one to one thousand trenches will be formed;

removal of insulating layer 11: along a length ranging between 10 and 5000 $\mu m$, preferably on the order of 100 $\mu m$; that is, on a total planar surface area ranging between 50 and $10^6$ $\mu m^2$, preferably on the order of $10^4$ $\mu m^2$; and dielectric 16: silicon oxide or tantalum oxide, of a thickness ranging between 10 and 100 nm, preferably on the order of 50 mn.

Then, for a planar surface on the order of 100 $\mu m$, considering that the first and second electrodes have the shape of horizontal combs such as illustrated in FIG. 4, the real coupling surface area is on the order of from 300 to 450$\mu m^2$, which provides a surface gain of from 3 to 5 with respect to a conventional capacitor formed in a same planar surface.

For a first electrode formed of two interconnected horizontal combs such as illustrated in FIG. 6 and in conditions similar to those of the preceding example:

the second electrode being formed by the sole filling of the interval between the two branches of the first electrode, the gain of active surface area of the capacitor is then substantially brought to 5; and the second electrode being a vertical comb, the gain is then increased by the plate surface area (not shown).

Of course, the present invention is likely to have various alterations, modifications, and improvements which will readily occur to those skilled in the art. In particular, the previously indicated numerical examples are linked to a specific manufacturing technology. Given the general tendency in semiconductor component manufacturing, these dimensions are bound to decrease.

Further, those skilled in the art will know how to give to the different electrodes the desired shapes to optimize the capacitance. For example, instead of being in top view a regular comb with rectangular teeth, an electrode may be formed to have in top view a broken line or zigzag shape. Moreover, those skilled in the art will known how to modify and complete the previously-described electrode patterns to enable the taking of contacts. Those skilled in the art will also know how to select. and adapt the used materials and their dimension according to the constraints of a specific manufacturing technology, and to the desired performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a capacitor with metal armatures in metallization levels above an integrated circuit, including the steps of:

a) depositing over the surface of an integrated circuit an insulating layer having a thickness ranging between 0.5 and 1.5 $\mu$m;

b) digging into the insulating layer to form trenches, of which at least a portion in top view is parallel and separate from one trench to the other;

c) depositing and leveling a metallic material to form conductive lines in the trenches separated by intervals;

d) locally removing the insulating layer to remove at least from all the insulating layer the intervals separating two conductive lines;

e) conformally depositing a dielectric; and f) depositing and etching a second metallic material to at least completely fill the intervals between conductive lines.

2. The method of claim 1, wherein step a) of deposition of the insulating layer is preceded by the forming in the underlying integrated circuit of a metal plate, the next step b) of digging into the insulating layer being performed so that the trenches reach said metal plate.

3. The method of claim 1, wherein step b) of digging into the insulating layer is performed to give to the trenches, in top view, a comb shape.

4. The method of claim 1, wherein the trenches are formed during step b) of digging into the insulating layer to have in top view the shape of two interdigited combs.

5. The method of claim 1, wherein step d) of removal of the insulating layer is performed across a given width ranging between 1 and 1.5 $\mu$m.

6. The method of claim 1, wherein the dielectric has a thickness ranging between 10 and 100 nm.

7. The method of claim 1, wherein step d) of local removal of the insulating layer is performed to form a comb shape in top view.

8. The method of claim 1, wherein the second metallic material is deposited and etched at step f) to expose the planar portions of the dielectric covering the upper surfaces of the insulating layer and conductive lines of the first metallic material.

9. The method of claim 1, wherein the dielectric is silicon oxide or tantalum oxide.

10. The method of claim 1, wherein the first metallic material is copper, and the second metallic material is titanium or tungsten.

* * * * *

UNITED STATES PATENT AND TRADEMARK OFFICE
CERTIFICATE OF CORRECTION

PATENT NO. : 6,706,589 B2  
APPLICATION NO. : 09/932468  
DATED : March 16, 2004  
INVENTOR(S) : Vincent Arnal and Joaquim Torres Page 1 of 1

It is certified that error appears in the above-identified patent and that said Letters Patent is hereby corrected as shown below:

On the title page item (74) should read:

(74) Attorney, Agent or Firm — Lisa K. Jorgenson; James H. Morris; Wolf, Greenfield & Sacks, P.C.

Claim 1, col. 7, lines 34-36 should read:

d) locally removing the insulating layer to remove the insulating layer at least from all the intervals separating two conductive lines;

Claim 7, col. 8, lines 22-24, should read as follows:

7. The method of claim 1, w herein step d) of locally removing the insulating layer is performed to form a comb shape in top view.

Signed and Sealed this

Twenty-fifth Day of December, 2007

JON W. DUDAS  
*Director of the United States Patent and Trademark Office*